(12) United States Patent
Lee et al.

(10) Patent No.: US 8,716,860 B2
(45) Date of Patent: May 6, 2014

(54) TIN-BASED SOLDER BALL AND SEMICONDUCTOR PACKAGE INCLUDING THE SAME

(71) Applicant: MK Electron Co., Ltd., Yongin-si (KR)

(72) Inventors: Young Woo Lee, Incheon (KR); Im Bok Lee, Yongin-si (KR); Sung Jae Hong, Yongin-si (KR); Jeong Tak Moon, Suwon-si (KR)

(73) Assignee: MK Electron Co., Ltd. (KR)

( * ) Notice: Subject to any disclaimer, the term of this patent is extended or adjusted under 35 U.S.C. 154(b) by 0 days.

(21) Appl. No.: 13/714,200

(22) Filed: Dec. 13, 2012

(65) Prior Publication Data

US 2013/0175688 A1 Jul. 11, 2013

(30) Foreign Application Priority Data

Dec. 14, 2011 (KR) .............................. 2011-0134466

(51) Int. Cl.
- *H01L 23/48* (2006.01)
- *H01L 23/52* (2006.01)
- *H01L 29/40* (2006.01)

(52) U.S. Cl.
USPC ..... 257/738; 257/779; 257/780; 257/E23.021

(58) Field of Classification Search
USPC .......................... 257/738, 779, 780, E23.021
See application file for complete search history.

(56) References Cited

U.S. PATENT DOCUMENTS

| | | | |
|---|---|---|---|
| 3,392,442 A * | 7/1968 | Napier et al. .................... 29/840 |
| 5,535,936 A * | 7/1996 | Chong et al. .................. 228/175 |
| 5,551,627 A * | 9/1996 | Leicht et al. .............. 228/180.22 |
| 5,953,623 A * | 9/1999 | Boyko et al. ................... 438/612 |
| 6,222,279 B1 * | 4/2001 | Mis et al. ........................ 257/779 |
| 6,335,104 B1 * | 1/2002 | Sambucetti et al. ........... 428/615 |
| 6,344,234 B1 * | 2/2002 | Dalal et al. .................... 427/96.8 |
| 6,399,475 B1 * | 6/2002 | Petit ................................ 438/614 |
| 6,517,602 B2 * | 2/2003 | Sato et al. ......................... 75/255 |
| 6,751,294 B1 * | 6/2004 | Blish, II et al. ................ 378/156 |
| 7,425,299 B2 * | 9/2008 | Kato et al. ...................... 420/560 |
| 7,682,468 B2 * | 3/2010 | Munekata et al. ............. 148/400 |
| 8,022,551 B2 * | 9/2011 | Soga et al. ...................... 257/772 |
| 8,159,059 B2 * | 4/2012 | Maeda ........................... 257/686 |
| 2004/0177997 A1* | 9/2004 | Hata et al. ...................... 174/257 |
| 2005/0029666 A1* | 2/2005 | Kurihara et al. ............... 257/772 |
| 2008/0078484 A1* | 4/2008 | Johns ............................. 148/678 |
| 2008/0159903 A1* | 7/2008 | Lewis et al. .................... 420/561 |
| 2008/0159904 A1* | 7/2008 | Lewis et al. .................... 420/561 |
| 2008/0203585 A1* | 8/2008 | Fogel et al. .................... 257/778 |
| 2008/0292492 A1* | 11/2008 | Ingham et al. ................. 420/561 |
| 2010/0200271 A1* | 8/2010 | Arvin et al. ................. 174/126.1 |
| 2012/0083113 A1* | 4/2012 | Arvin et al. .................... 438/613 |

FOREIGN PATENT DOCUMENTS

| | | |
|---|---|---|
| JP | 2004-188453 A | 7/2004 |
| JP | 2004-261863 A | 9/2004 |
| JP | 3602529 B1 | 6/2005 |

(Continued)

*Primary Examiner* — Ida M Soward

(74) *Attorney, Agent, or Firm* — Volpe and Koenig, P.C.

(57) ABSTRACT

A tin (Sn)-based solder ball and a semiconductor package including the same are provided. The tin-based solder ball includes about 0.2 to 4 wt. % silver (Ag), about 0.1 to 1 wt. % copper (Cu), about 0.001 to 0.3 wt. % aluminum (Al), about 0.001% to 0.1 wt. % germanium (Ge), and balance of tin and unavoidable impurities. The tin-based solder ball has a high oxidation resistance.

14 Claims, 10 Drawing Sheets

(56) References Cited

FOREIGN PATENT DOCUMENTS

| | | |
|---|---|---|
| JP | 4392020 B2 | 9/2005 |
| JP | 2008012576 A | 1/2008 |
| KR | 10-2008-0106887 A | 12/2008 |
| KR | 10-2010-0001256 A | 1/2010 |

* cited by examiner

FIG. 2

| SAMPLE | COMPOSITION (wt%) | | | | | | HIGH-TEMPERATURE HIGH-HUMIDITY CHARACTERISTIC (BASIS DIAMETER: 0.3mm) | | | | | | |
|---|---|---|---|---|---|---|---|---|---|---|---|---|---|
| | | | | | | | DISCOLORATION | | SPREADING (μm) | | OXYGEN CONTENT (ppm) | | |
| | Sn | Ag | Cu | Al | P | Ge | 72hr | 168hr | 72hr | 168hr | 72hr | 168hr | |
| COMPARATIVE EXAMPLE 1 | REMAINDER | 3.0 | 0.5 | - | - | - | ○ | ○ | 50 | 42 | 80 | 112 | |
| COMPARATIVE EXAMPLE 2 | REMAINDER | 3.0 | 0.3 | - | - | - | ○ | ○ | 48 | 40 | 82 | 115 | |
| COMPARATIVE EXAMPLE 3 | REMAINDER | 3.0 | 0.8 | - | - | - | ○ | ○ | 51 | 42 | 80 | 110 | |
| COMPARATIVE EXAMPLE 4 | REMAINDER | 1.0 | 0.5 | - | - | - | ○ | ○ | 55 | 46 | 92 | 125 | |
| EXPERIMENTAL EXAMPLE 1 | REMAINDER | 3.0 | 0.5 | 0.002 | - | - | ○ | ○ | 100 | 60 | 76 | 96 | |
| EXPERIMENTAL EXAMPLE 2 | REMAINDER | 3.0 | 0.5 | 0.005 | - | - | △ | △ | 400 | 80 | 56 | 74 | |
| EXPERIMENTAL EXAMPLE 3 | REMAINDER | 3.0 | 0.5 | 0.02 | - | - | × | △ | 420 | 340 | 32 | 65 | |
| EXPERIMENTAL EXAMPLE 4 | REMAINDER | 3.0 | 0.5 | 0.1 | - | - | × | △ | 411 | 335 | 36 | 64 | |
| EXPERIMENTAL EXAMPLE 5 | REMAINDER | 3.0 | 0.5 | 0.2 | - | - | × | △ | 250 | 200 | 45 | 70 | |
| EXPERIMENTAL EXAMPLE 6 | REMAINDER | 3.0 | 0.5 | - | 0.005 | - | △ | ○ | 373 | 55 | 71 | 98 | |
| EXPERIMENTAL EXAMPLE 7 | REMAINDER | 3.0 | 0.5 | - | 0.01 | - | △ | △ | 402 | 338 | 64 | 80 | |
| EXPERIMENTAL EXAMPLE 8 | REMAINDER | 3.0 | 0.5 | - | 0.03 | - | △ | △ | 360 | 324 | 74 | 86 | |
| EXPERIMENTAL EXAMPLE 9 | REMAINDER | 3.0 | 0.5 | - | - | 0.001 | ○ | ○ | 80 | 62 | 75 | 100 | |
| EXPERIMENTAL EXAMPLE 10 | REMAINDER | 3.0 | 0.5 | - | - | 0.01 | × | △ | 414 | 402 | 33 | 64 | |
| EXPERIMENTAL EXAMPLE 11 | REMAINDER | 3.0 | 0.5 | - | - | 0.05 | × | △ | 400 | 350 | 38 | 68 | |
| EXPERIMENTAL EXAMPLE 12 | REMAINDER | 3.0 | 0.3 | 0.02 | - | 0.01 | × | × | 415 | 390 | 32 | 65 | |
| EXPERIMENTAL EXAMPLE 13 | REMAINDER | 3.0 | 0.5 | 0.02 | - | 0.05 | × | × | 452 | 448 | 28 | 32 | |
| EXPERIMENTAL EXAMPLE 14 | REMAINDER | 3.0 | 0.5 | 0.02 | - | 0.01 | × | × | 410 | 385 | 30 | 70 | |
| EXPERIMENTAL EXAMPLE 15 | REMAINDER | 3.0 | 0.5 | 0.1 | - | 0.05 | × | × | 412 | 395 | 33 | 68 | |
| EXPERIMENTAL EXAMPLE 16 | REMAINDER | 3.0 | 0.5 | 0.1 | - | 0.01 | × | △ | 408 | 390 | 35 | 70 | |
| EXPERIMENTAL EXAMPLE 17 | REMAINDER | 3.0 | 0.5 | 0.2 | - | 0.05 | × | × | 265 | 240 | 50 | 78 | |
| EXPERIMENTAL EXAMPLE 18 | REMAINDER | 3.0 | 0.5 | 0.2 | - | 0.01 | × | △ | 280 | 245 | 48 | 72 | |
| EXPERIMENTAL EXAMPLE 19 | REMAINDER | 3.0 | 0.8 | 0.02 | - | 0.05 | × | × | 418 | 415 | 36 | 55 | |
| EXPERIMENTAL EXAMPLE 20 | REMAINDER | 3.0 | 0.5 | - | 0.01 | 0.01 | × | △ | 450 | 392 | 30 | 54 | |
| EXPERIMENTAL EXAMPLE 21 | REMAINDER | 1.0 | 0.5 | 0.02 | - | 0.01 | × | × | 445 | 448 | 32 | 36 | |
| EXPERIMENTAL EXAMPLE 22 | REMAINDER | 1.0 | 0.5 | - | 0.01 | 0.01 | × | △ | 442 | 366 | 33 | 61 | |

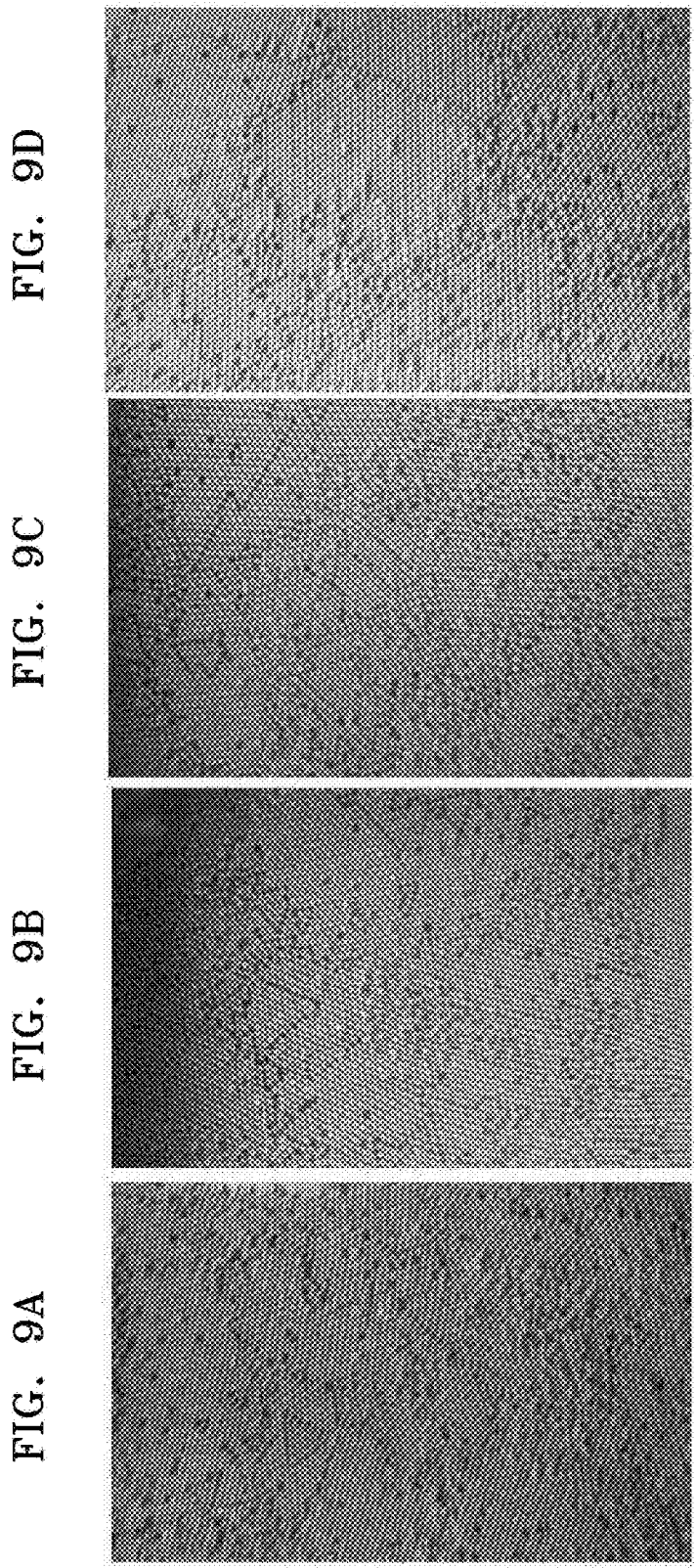

TIN-BASED SOLDER BALL AND SEMICONDUCTOR PACKAGE INCLUDING THE SAME

CROSS-REFERENCE TO RELATED PATENT APPLICATION

This application claims the benefit of Korean Patent Application No. 10-2011-0134466, filed on Dec. 14, 2011, in the Korean Intellectual Property Office, the disclosure of which is incorporated herein in its entirety by reference.

BACKGROUND OF THE INVENTION

1. Field of the Invention

The present invention relates to a tin (Sn)-based solder ball and a semiconductor package, and more particularly, to a tin-based solder ball containing silver (Ag) and copper (Cu) and a semiconductor package including the same.

2. Description of the Related Art

With the trend toward highly efficient, downscaled electronic devices, miniaturizing packages during an assembly process of the electronic devices is required. Thus, solder balls are being used instead of conventional lead frames to attain miniaturization of the packages. The solder balls may serve to bond a substrate with a package and transmit signals from chips of the package to a substrate.

To reduce environmental pollution, lead (Pb)-free solder balls have been proposed. For example, although solder balls formed of a ternary lead-free solder alloy (e.g., tin (Sn)-silver (Ag)-copper (Cu)) have been suggested, the solder balls may have low thermal cyclic characteristics and be vulnerable to oxidation and solder has a low spreading and low wettability. Thus, the suggested solder balls have poor workability and weak resistance to shocks, so the solder balls are inappropriate for portable electronic products. Accordingly, there have been attempts at improving characteristics of solder balls by further adding another element to Sn—Ag—Cu, but the characteristics of the solder balls largely vary according to the kind and content of the element.

RELATED ART DOCUMENT

1. Registered Japanese Patent No. 3602529 (Oct. 1, 2004)
2. Registered Japanese Patent No. 4392020 (Oct. 16, 2009)
3. Published Japanese Patent No. 2004-188453 (Jul. 8, 2004)

SUMMARY OF THE INVENTION

The present invention provides a tin (Sn)-based solder ball having a high oxidation resistance.

The present invention also provides a semiconductor package including the Sn-based solder ball.

According to an aspect of the present invention, there is provided a tin-based solder ball including: about 0.2 to 4 wt. % (weight percent) silver (Ag), about 0.1 to 1 wt. % copper (Cu), about 0.001 to 0.3 wt. % aluminum (Al), about 0.001% to 0.1 wt. % germanium (Ge), and balance of tin (Sn) and unavoidable impurities.

The tin-based solder ball may include about 0.2 to 4 wt. % silver, about 0.1 to 1 wt. % copper, about 0.002 to 0.2 wt. % aluminum, about 0.002 to 0.05 wt. % germanium, and balance of tin and unavoidable impurities.

The tin-based solder ball may include about 0.2 to 4 wt. % silver, about 0.1 to 1 wt. % copper, about 0.002 to 0.2 wt. % aluminum, about 0.01 to 0.05 wt. % germanium, and balance of tin and unavoidable impurities.

According to another aspect of the present invention, there is provided a tin-based solder ball including: about 0.2 to 4 wt. % silver, about 0.1 to 1 wt. % copper, about 0.001 to 0.3 wt. % phosphorus (P), about 0.001 to 0.1 wt. % germanium, and balance of tin and unavoidable impurities.

The tin-based solder ball may include about 0.2 to 4 wt. % silver, about 0.1 to 1 wt. % copper, about 0.001 to 0.3 wt. % phosphorus, about 0.002 to 0.05 wt. % germanium, and balance of tin and unavoidable impurities.

The tin-based solder ball may include about 0.2 to 4 wt. % silver, about 0.1 to 1 wt. % copper, about 0.001 to 0.03 wt. % phosphorus, about 0.01 to 0.05 wt. % germanium, and balance of tin and unavoidable impurities.

According to another aspect of the present invention, there is provided a semiconductor package including the tin-based solder ball containing about 0.2 to 4 wt. % silver, about 0.1 to 1 wt. % copper, about 0.001 to 0.3 wt. % aluminum, about 0.001% to 0.1 wt. % germanium, and balance of tin and unavoidable impurities.

The tin-based solder ball may have good spreading characteristics and a high oxidation resistance to prevent discoloration, after kept in a high-temperature high-humidity atmosphere.

BRIEF DESCRIPTION OF THE DRAWINGS

The above and other features and advantages of the present invention will become more apparent by describing in detail exemplary embodiments thereof with reference to the attached drawings in which:

FIG. 2 shows composition ratios of solder balls prepared by varying compositions of solder balls according to embodiments of the present invention;

FIGS. 9A through 9D are images showing the degrees of discoloration after solder balls according to embodiments of the present invention are kept for about 168 hours in high-temperature and high-humidity atmospheres;

DETAILED DESCRIPTION OF THE INVENTION

Figure 1A:
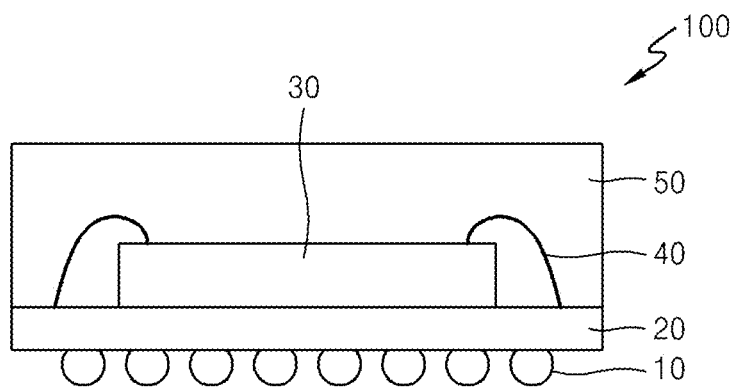
FIGS. 1A through 1C are schematic views of semiconductor packages including solder balls according to embodiments of the present invention.

The present invention is described more fully hereinafter with reference to the accompanying drawings, in which embodiments of the invention are shown. In the drawings, the same reference numerals are used to denote the same elements, and repeated description thereof is omitted. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, thicknesses or sizes of respective layers may be exaggerated for brevity.

Figure 1B:
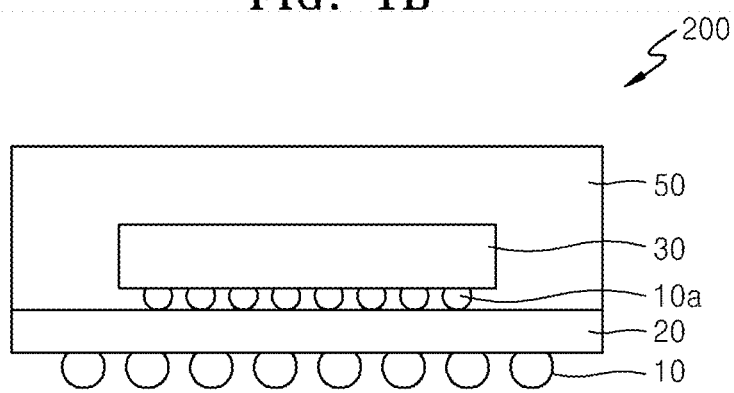
Figure 1C:
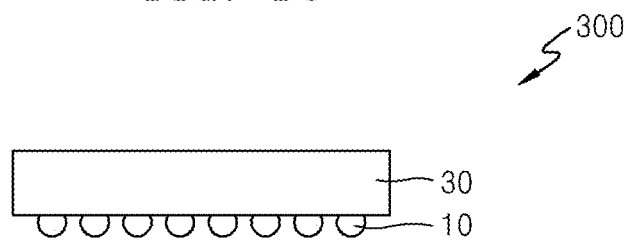

FIGS. 1A through 1C are schematic views of semiconductor packages including solder balls according to embodiments of the present invention.

Referring to FIG. 1A, a semiconductor package 100 may include solder balls 10, a printed circuit board (PCB) 20, bonding wires 40, and a sealant 50. The semiconductor chip 30 may be mounted on the PCB 20 and electrically connected to the PCB 20 using the bonding wires 40. The solder balls 10 may be adhered to a bottom surface of the PCB 20 and electrically connected to the semiconductor chip 30 through vias (not shown) formed in the PCB 20. The sealant 50 may be formed on the PCB 20 and seal the semiconductor chip 30 and the bonding wire 40. The compositions and shapes of the solder balls 10 will be described in detail later. Although FIG. 1A shows an example in which one semiconductor chip 30 is mounted on the PCB 20, in another embodiment, a plurality of semiconductor chips 30 may be mounted.

Referring to FIG. 1B, a semiconductor package 200 may include first solder balls 10a and second solder balls 10b. A semiconductor chip 30 may be connected to the PCB 20 using the first solder balls 10a. The second solder balls 10b may be adhered to a bottom surface of the PCB 20 and electrically connected to the semiconductor chip 30 through vias (not shown) formed in the PCB 20. A sealant 50 may be formed on the PCB 20 and seal the semiconductor chip 30 and the first solder balls 10a. The first solder balls 10a may be tin-based solder balls having substantially the same composition as the second solder balls 10b. The first solder balls 10a may be formed to a smaller size than the second solder balls 10b.

Referring to FIG. 1C, a semiconductor package 300 may include a semiconductor chip 30 and solder balls 10. The semiconductor chip 30 may be a system on chip (SOC) chip or a system in package (SIP) chip.

Hereinafter, solder balls according to embodiments of the present invention will be described.

The solder balls according to the embodiments may include about 0.2 to 4 wt. % silver (Ag) and about 0.1 to 1 wt. % copper (Cu), at least one of about 0.001 to 0.3 wt. % aluminum (Al), about 0.001 to 0.3 wt. % phosphorus (P), and about 0.001 to 0.1 wt. % germanium (Ge), and balance of tin (Sn) and unavoidable impurities. For example, the solder balls may include about 0.2 to 4 wt. % silver, about 0.1 to 1 wt. % copper, about 0.001 to 0.3 wt. % aluminum, about 0.001 to 0.1 wt. % germanium, and balance of tin and unavoidable impurities.

The solder balls may include about 0.2 to 4 wt. % silver. When silver is contained in the tin-based solder balls, the adhesive property of the solder balls may be improved. Meanwhile, when silver is contained at an excessively high content, a melting point of the solder balls may be increased to preclude formation of bumps.

The solder balls may contain about 0.1 to 1 wt. % copper. When copper is partially contained in the solder balls, the joint characteristics such as solder joint reliability and joint strength of the solder balls may be improved. Meanwhile, when copper is contained at an excessively high content, copper bridges may be formed at a high temperature, and voids may be formed in copper, thereby degrading the joint characteristics.

Aluminum, phosphorus, or germanium may be added in a small amount to the ternary tin-silver-copper solder balls and prevent oxidation of the solder balls. For example, solder balls containing about 0.001 to 0.3 wt. % aluminum may have improved oxidation resistance in a high-temperature, high-humidity atmosphere.

When at least one species of aluminum, phosphorus, and germanium is added in a small amount, the added element may be oxidized earlier than tin to form a native oxide layer on the surfaces of the solder balls and prevent oxidation of tin. Meanwhile, when aluminum, phosphorus, or germanium is added at an excessively high content, the added element may form an inter-metallic compound with copper or may be precipitated and oxidized to degrade performance of the solder balls.

The solder balls according to the embodiments of the present invention may contain about 0.2 to 4 wt. % of silver and about 0.1 to 1 wt. % copper, at least one of about 0.001 to 0.3 wt. % aluminum, about 0.001 to 0.3 wt. % phosphorus, and about 0.001 to 0.1 wt. % germanium, and balance of tin and unavoidable impurities, and have improved high-temperature, high-humidity characteristics. For example, after the solder balls are kept for a predetermined period of time, spread characteristics of solder balls may be estimated, or the oxidation resistance of the solder balls may be estimated by measuring the content of oxygen remaining in the solder balls. The oxygen resistances of solder balls according to experimental examples of the present invention will now be described with reference to graphs and images of FIGS. 3A through 9D.

Hereinafter, methods of fabricating solder balls according to embodiments of the present invention and methods of estimating high-temperature high-humidity characteristics and mechanical strengths of the solder balls will be described.

1. Fabrication of Solder Balls According to Experimental and Comparative Examples FIG. 2 shows composition ratios of solder balls prepared by varying compositions of solder balls according to embodiments of the present invention.

Each of solder balls according to Experimental Examples contains silver, copper, tin, and a small amount of at least one element of aluminum, phosphorus, and germanium. Specifically, each of the solder balls according to Experimental Examples may include about 0.2 to 4 wt. % silver, about 0.1 to 1 wt. % copper, at least one of about 0.001 to 0.3 wt. % aluminum, about 0.001 to 0.3 wt. % phosphorus, and about 0.001 to 0.3 wt. % germanium, and balance (i.e., remainder) of tin. As shown in FIG. 2, the solder balls according to the embodiments were prepared by varying contents of the respective elements. A solder ball according to Comparative Example included about 0.1 to 5 wt. % silver, about 0.1 to 2 wt. % copper, and balance of tin. Each of the solder balls according to Experimental and Comparative Examples was formed in a ball shape having a diameter of about 0.3 mm.

2. Storage of Solder Balls in High-Temperature High-Humidity Conditions

Solder balls were kept for about 72 hours and 168 hours, respectively, in a chamber maintained at a temperature of about 85° C. and a humidity of about 85% under the conditions of a steady-state temperature humidity bias life test (JESD22-A-101-B).

3. Estimation of Spread Characteristics

After the solder balls according to Experimental and Comparative examples were kept in high-temperature and high-humidity atmospheres, spread characteristics of the solder balls were estimated. The spread characteristics were tested under conditions according to JIS Z 3198-3 (a lead-free solder spreading test). Specifically, flux was coated on a copper-plate polished using a hydrochloric acid (HCl) solution, a solder ball was adhered onto the flux, and a reflow process was performed. After the reflow process, the diameter of the spreading area of the solder ball was measured.

4. Measurement of Oxygen Content

After the solder balls according to Experimental and Comparative examples were kept in high-temperature high-humidity atmospheres, the contents of oxygen remaining in the solder balls were measured. Specifically, when 1 g of solder ball was instantaneously melted by applying heat to 1 g of solder ball in the atmosphere of an inert gas (e.g., helium (He)), the amount of carbon dioxide ($CO_2$) generated was measured to calculate the amount of oxygen.

5. Observation of the Degree of Discoloration

After the solder balls according to Experimental and Comparative examples were kept for about 72 hours and about 168 hours, respectively, in high-temperature high-humidity atmospheres, the degrees of discoloration of the solder balls were observed with the naked eye. In an initial state, the solder balls assumed glossy, metallic silver-gray. After kept in the high-temperature high-humidity atmospheres, when a solder ball assumed silver gray, which was about the same as the initial color, the corresponding solder was indicated by X. When a solder ball was slightly dark and partially assumed yellow, the corresponding solder ball was indicated by □. When a solder ball became discoloured and assumed yellow, the corresponding solder ball was indicated by ○.

6. Estimation of Hardness

Mechanical properties of the solder balls according to Experimental and Comparative examples were estimated via a hardness test. To make the hardness test, a load of about 10 mN was applied to each of a solder ball put in an initial state and a reflowed solder ball for about 15 seconds, the length of an indentation mark was measured.

7. Drop Test

The joint reliability of each of the solder balls according to Experimental and Comparative examples was estimated via a drop test. To make a joint reliability test, solder balls having a diameter of about 0.3 mm were disposed on an electrode of a package coated with water-soluble flux, and a reflow process was performed to mount the solder balls onto the package. Then, the solder balls attached to the package were adhered to an electrode made of solder paste of a printed substrate so that the package and the printed substrate were connected through the solder balls.

Figure 11:
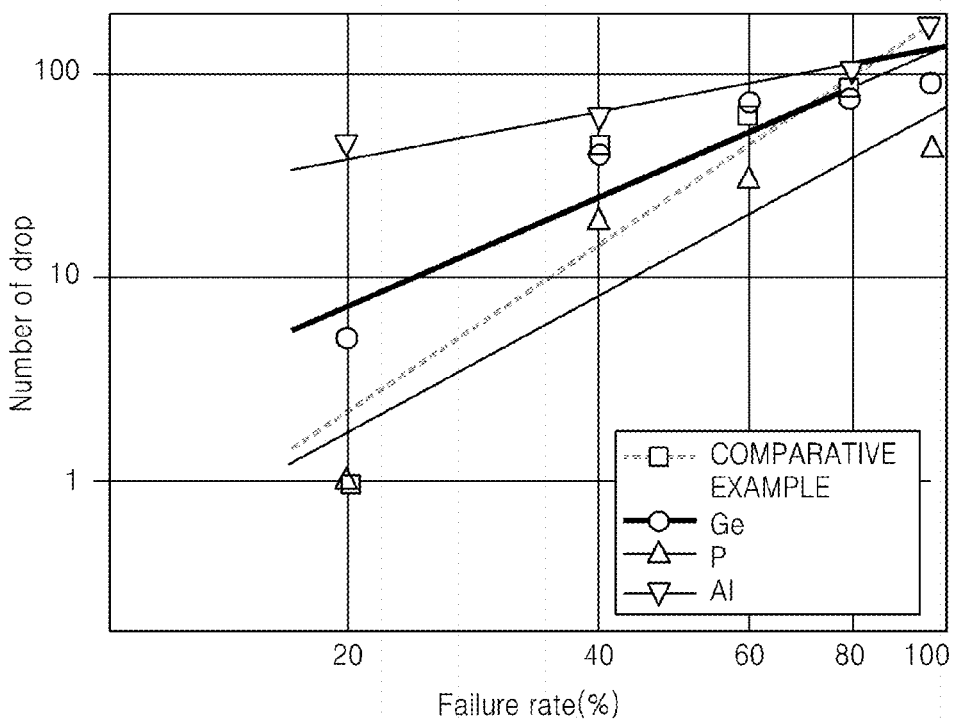
FIG. 11 is a graph showing results of a drop test made on solder balls according to embodiments of the present invention.

The drop test was estimated under conditions according to JESD22-B104(a mechanical shock test. Specifically, the substrate was dropped under the conditions of 1500 g and 0.5 ms until the solder balls were disjointed, and it was observed whether or not a chip was adhered. The substrate was dropped a total of 173 times, and drop tests were made until the solder balls were disjointed, thereby obtaining cumulative failure rates. Thus, the distribution of a relationship between the number of drops and a cumulative failure rate is shown in FIG. 11.

FIGS. 3A through 8B are graphs showing high-temperature, high-humidity characteristics of solder balls according to embodiments of the present invention.

Figure 3A:
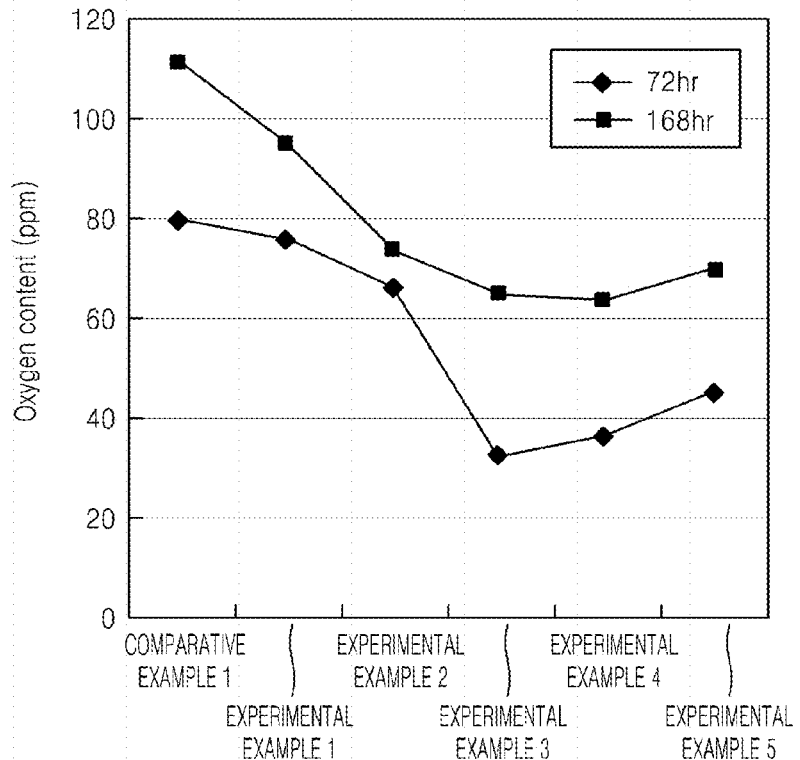
FIGS. 3A through 8B are graphs showing high-temperature, high-humidity characteristics of solder balls according to embodiments of the present invention.
Figure 3B:
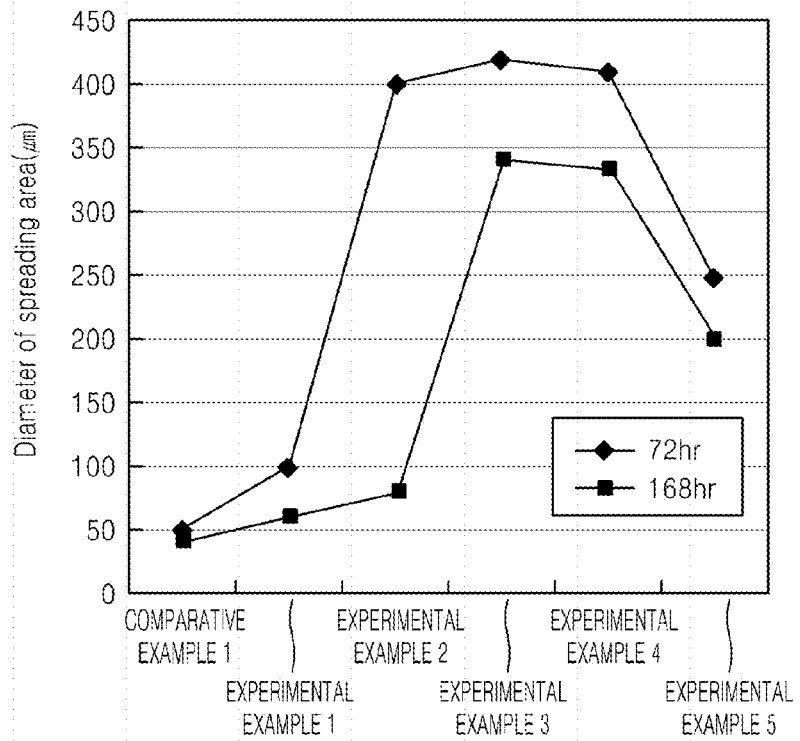

FIGS. 3A and 3B respectively illustrate an oxygen content and spreading characteristics relative to an aluminum content after tin-silver-copper solder balls to which about 0.002 to 0.2 wt. % aluminum was added were kept in a high-temperature high-humidity atmosphere. Table 1 shows the high-temperature high-humidity characteristics of the solder balls in which aluminum was contained at different contents.

TABLE 1

| | | | | | | | High-temperature high-humidity characteristics (Ball diameter: 0.3 mm) | | | | | |
|---|---|---|---|---|---|---|---|---|---|---|---|---|
| | Composition (wt %) | | | | | | Discoloration | | Spreading (μm) | | Oxygen content (ppm) | |
| Sample | Sn | Ag | Cu | Al | P | Ge | 72 hr | 168 hr | 2 hr | 168 hr | 72 hr | 168 hr |
| Comparative example 1 | Remainder | 3 | 0.5 | — | — | — | ○ | ○ | 50 | 42 | 80 | 112 |
| Experimental example 1 | Remainder | 3 | 0.5 | 0.002 | — | — | ○ | ○ | 100 | 60 | 76 | 96 |
| Experimental example 2 | Remainder | 3 | 0.5 | 0.005 | — | — | Δ | ○ | 400 | 80 | 66 | 74 |
| Experimental example 3 | Remainder | 3 | 0.5 | 0.02 | — | — | X | Δ | 420 | 340 | 32 | 65 |
| Experimental example 4 | Remainder | 3 | 0.5 | 0.1 | — | — | X | Δ | 411 | 335 | 36 | 64 |
| Experimental example 5 | Remainder | 3 | 0.5 | 0.2 | — | — | X | Δ | 250 | 200 | 45 | 70 |

Referring to FIG. 3A, as the aluminum content of an aluminum-containing solder ball increased, the oxygen content thereof was reduced after the solder ball was kept in the high-temperature high-humidity atmosphere. However, when aluminum was contained at a specific content or more, the oxygen content of the solder ball increased again.

Specifically, after an aluminum-free solder ball according to Comparative example was kept for about 72 hours in a high-temperature high-humidity chamber, the content of oxygen remaining in the aluminum-free solder ball was about 80 ppm. When the aluminum content of the solder ball according to Experimental example gradually increased, that is, was 0.002, 0.005, 0.02, 0.1, and 0.2 wt. %, respectively, the content of the remaining oxygen was 76, 66, 32, 36, and 45 ppm, respectively. That is, as the aluminum content increases, the content of the remaining oxygen may be reduce, and as the aluminum content further increases, the content of the remaining oxygen may rather increase. Accordingly, solder balls (refer to Experimental examples 3 and 4) containing about 0.02 wt. % aluminum and about 0.1 wt. % aluminum exhibited the smallest oxygen contents.

When kept for about 168 hours in a high-temperature high-humidity chamber, the solder ball according to Comparative example exhibited the remaining oxygen content of about 112 ppm, which was higher than when kept for about 72 hours. This is because oxidization of the solder ball is further generated as a time duration for which a solder ball is kept in the high-temperature high-humidity chamber increases. Similarly, when kept for about 168 hours, all the solder balls according to Experimental examples contained the remaining oxygen at higher contents than when kept for about 72 hours. However, like the case in which the solder balls were kept for about 72 hours, the solder balls (refer to Experimental examples 3 and 4) containing about 0.02 wt. % aluminum and about 0.1 wt. % aluminum exhibited the smallest oxygen contents when kept for about 168 hours.

After the solder balls are kept in the high-temperature high-humidity chamber, the content of oxygen remaining in the solder balls may vary according to the degree of oxidization of a metal, such as tin or aluminum In the case of Comparative example, since tin was easily oxidized after the solder balls are kept in the high-temperature high-humidity chamber, the remaining oxygen content also increased. Meanwhile, in the aluminum-containing solder balls according to Experimental examples, when aluminum was contained at a predetermined content of, for example, about 0.02 wt. % or less, since a surface oxide layer was firstly formed using aluminum and tended to prevent oxidation of the solder balls. However, when aluminum was contained at an excessively high content, the characteristics of the solder balls were degraded due to oxidation of aluminum.

Referring to FIG. 3B, in the aluminum-containing solder balls, as the aluminum content increased, spreading characteristics of the solder balls were improved after the solder balls were kept in the high-temperature high-humidity chamber. Also, when the aluminum content became higher than a specific content, the spreading characteristics of the solder balls were rather degraded.

Specifically, after the aluminum-free solder ball according to Comparative example was kept for about 72 hours in the high-temperature high-humidity chamber, the spreading of the solder ball was about 50 μm. When the aluminum content increased, that is, when the aluminum content was 0.002, 0.005, 0.02, 0.1, and 0.2 wt. %, the spreading of the solder ball was 100, 400, 420, 411, and 250 μm, respectively. That is, as the aluminum content increased, the spreading characteristics of the solder ball were improved. When the aluminum content excessively increased, the spreading characteristics were rather degraded. The solder balls (refer to Experimental examples 2, 3, and 4) containing about 0.005 to 0.1 wt. % exhibited the best spreading characteristics.

When kept for about 168 hours in the high-temperature high-humidity chamber, the spreading of the solder ball according to Comparative example was about 42 μm, which was lower than when kept for about 72 hours. This is because oxidization of the solder ball is further generated as a time duration for which a solder ball is kept in the high-temperature high-humidity chamber increases. Similarly, when kept for about 168 hours, all the solder balls according to Experimental examples exhibited worse spreading characteristics than when kept for about 72 hours. However, like the case in which the solder balls were kept for about 72 hours, the solder balls (refer to Experimental examples 3 and 4) containing about 0.02 wt. % aluminum and about 0.1 wt. % aluminum exhibited the best spreading characteristics when kept for about 168 hours.

The spreading characteristics of the solder balls may be relevant to the remaining oxygen contents thereof and vary according to the degree of oxidation of a metal, such as aluminum. That is, when the degree of oxidation of the solder ball increases, an undesired oxide may be formed in the solder ball so that a melting point of the solder ball may be raised and the brittleness of the solder ball may increase. Thus, the solder ball may not easily spread during a reflow process for bonding the solder ball onto a substrate.

Figure 4A:
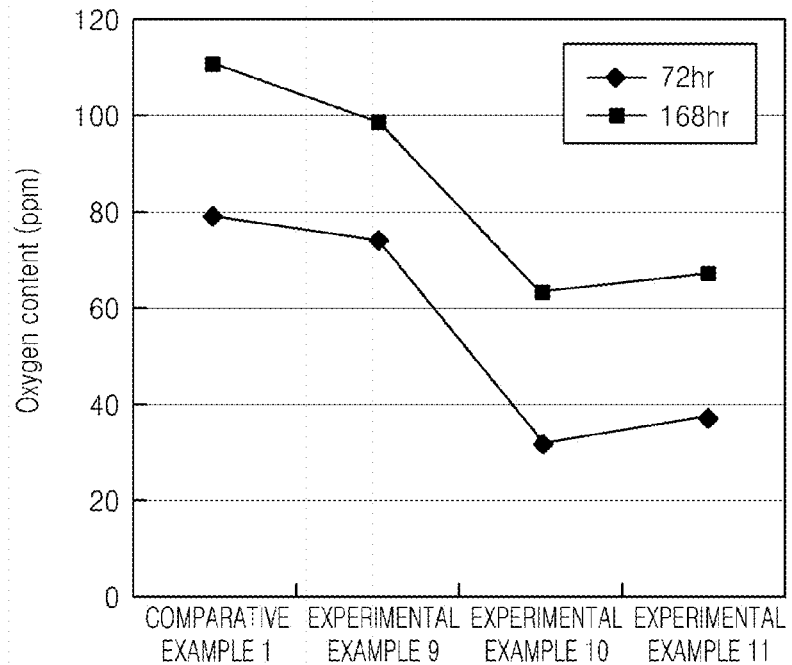
Figure 4B:
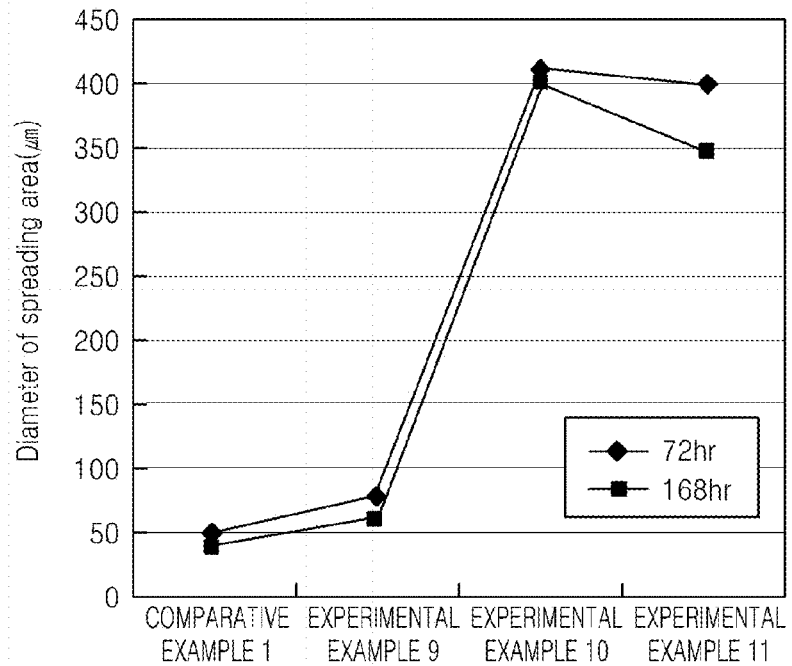

FIGS. 4A and 4B respectively illustrate an oxygen content and spreading characteristics relative to a germanium content after tin-silver-copper solder balls to which about 0.001 to 0.05 wt. % germanium was added were kept in a high-temperature high-humidity atmosphere. Table 2 shows the high-temperature high-humidity characteristics of the solder balls in which germanium were contained at different contents.

TABLE 2

| | | | | | | | High-temperature high-humidity characteristics (Ball diameter: 0.3 mm) | | | | | |
|---|---|---|---|---|---|---|---|---|---|---|---|---|
| | Composition (wt %) | | | | | | Discoloration | | Spreading (μm) | | Oxygen content (ppm) | |
| Sample | Sn | Ag | Cu | Al | P | Ge | 72 hr | 168 hr | 72 hr | 168 hr | 72 hr | 68 hr |
| Comparative example 1 | Remainder | 3 | 0.5 | — | — | — | ○ | ○ | 50 | 42 | 80 | 112 |
| Experimental example 9 | Remainder | 3 | 0.5 | — | — | 0.001 | ○ | ○ | 80 | 62 | 75 | 100 |
| Experimental example 10 | Remainder | 3 | 0.5 | — | — | 0.01 | X | Δ | 414 | 402 | 33 | 64 |
| Experimental example 11 | Remainder | 3 | 0.5 | — | — | 0.05 | X | Δ | 400 | 350 | 38 | 68 |

Referring to FIG. 4A, as a germanium content of a germanium-containing solder ball increases, an oxygen content thereof is reduced. Specifically, after kept for about 72 hours in a high-temperature high-humidity chamber, the remaining oxygen content of a germanium-free solder ball according to Comparative example was 80 ppm, while the remaining oxygen contents of solder balls according to Experimental examples to which 0.001, 0.01, and 0.05 wt. % germanium were added were 75, 33, and 38 ppm, respectively. That is, as the germanium content of the solder ball increases, the oxidation resistance of the solder ball may be improved to prevent oxidation of the solder ball.

Referring to FIG. 4B, after kept in the high-temperature high-humidity chamber, the spreading characteristics of the germanium-containing solder ball were improved. Specifically, after kept for about 72 hours in the high-temperature high-humidity chamber, the spreading of the germanium-free solder ball according to Comparative example was about 50 μm. When the germanium content of the solder ball gradually increased, for example, when the germanium content of the solder ball was 0.001, 0.01, and 0.05, respectively, the spreading of the solder ball was 80, 414, and 400 μm, respectively. When kept for about 168 hours in the high-temperature high-humidity chamber, the spreading of the solder ball according to Comparative example was 42 μm, which was lower than when kept for about 72 hours, and the solder balls according to Experimental examples had a spreading of 62, 402, and 400 μm, respectively. Solder balls (refer to Experimental examples 10 and 11) containing about 0.001 wt. % germanium and about 0.05 wt. % germanium had good spreading characteristics even after kept for about 168 hours.

Figure 5A:
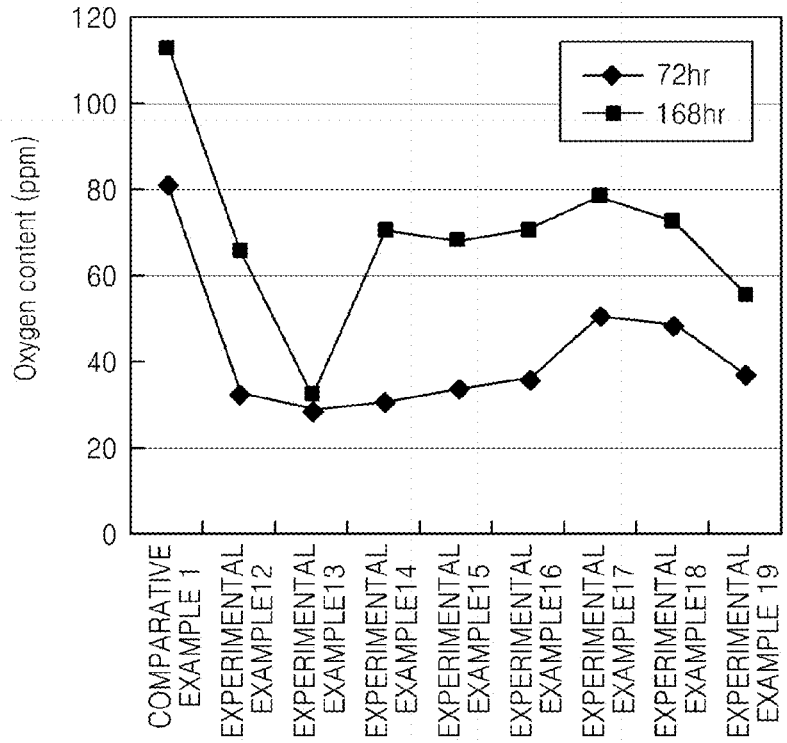
Figure 5B:
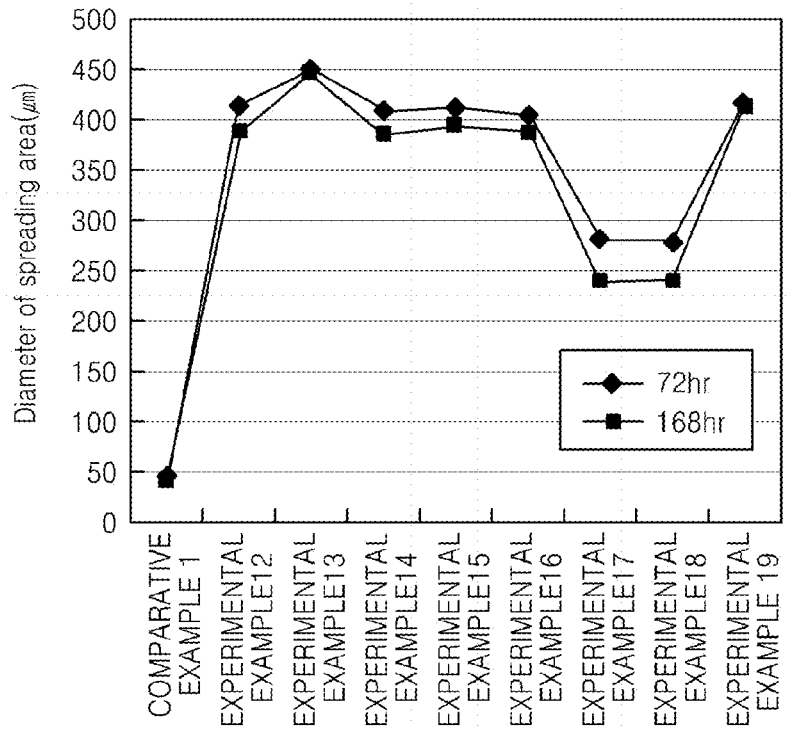

FIGS. 5A and 5B respectively illustrate an oxygen content and spreading characteristics relative to a germanium content after tin-silver-copper solder balls to which about 0.02 to 0.2 wt. % aluminum and about 0.01 to 0.05 wt. % germanium were added were kept in a high-temperature high-humidity atmosphere. Table 3 shows the high-temperature high-humidity characteristics of the solder balls in which aluminum and germanium were contained at different contents.

Referring to FIG. 5A, solder balls containing aluminum and germanium had higher oxidation resistances than the solder ball according to Comparative Example 1. Specifically, a solder ball (refer to Experimental example 13) containing about 0.02 wt. % aluminum and about 0.01 wt. % germanium had oxygen contents of about 28 ppm and about 32 ppm and spreadings of about 452 μm and about 448 μm after kept for about 72 hours and about 168 hours, respectively, and exhibited the best high-temperature high-humidity characteristics. Also, when the solder ball was observed with the naked eye after kept in a high-temperature high-humidity atmosphere, discoloration of the solder ball was not observed (i.e., color of the solder balls did not changed after high-temperature storage). Meanwhile, solder balls containing about 0.2 wt. % aluminum according to Experimental examples 17 and 18 exhibited high remaining oxygen contents and low spreading characteristics irrespective of the weight proportion of germanium. In the case of solder balls containing aluminum at a predetermined content or more, aluminum may be oxidized to degrade characteristics of the solder ball, rather than used to form a protection layer.

Figure 6A:
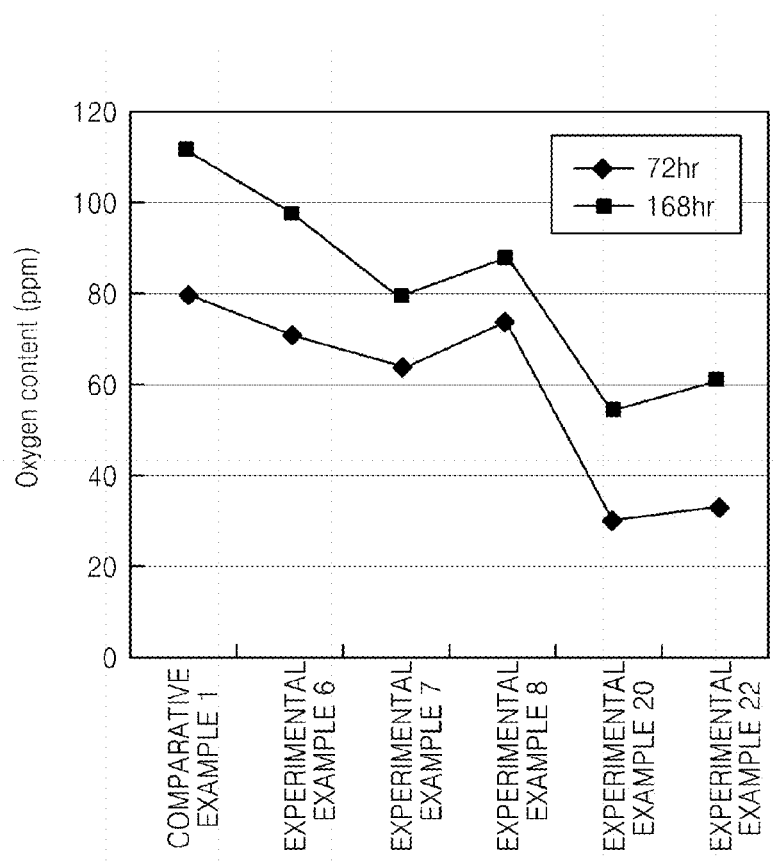
Figure 6B:
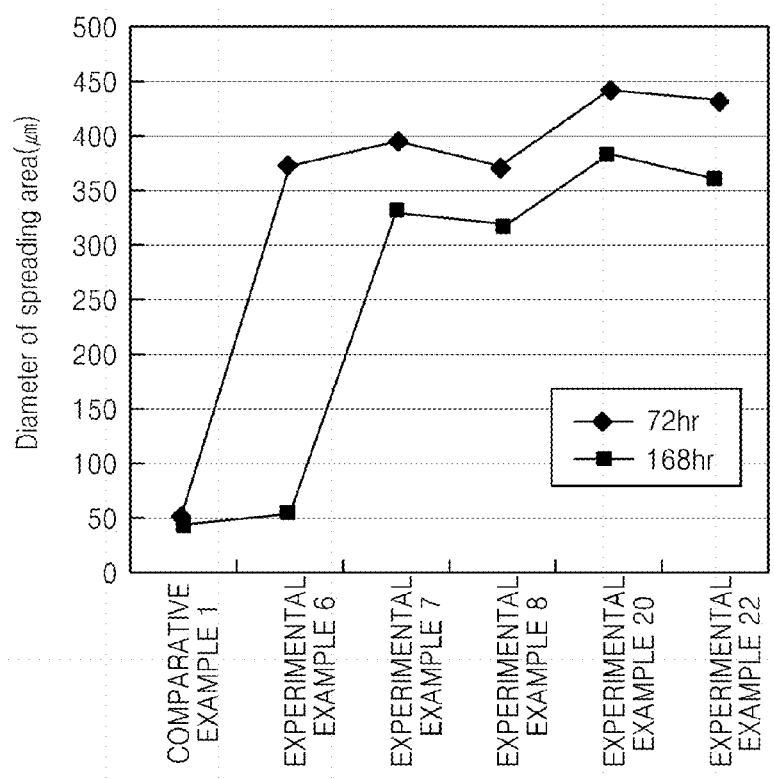

FIGS. 6A and 6B respectively illustrate an oxygen content and spreading characteristics after tin-silver-copper solder balls to which about 0.001 to 0.3 wt. % phosphorus and about 0.01 to 0.05 wt. % germanium were added were kept in a high-temperature high-humidity atmosphere. Table 4 shows the high-temperature high-humidity characteristics of the solder balls in which phosphorus and germanium were contained at different contents.

TABLE 3

| | Composition (wt %) | | | | | | High-temperature high-humidity characteristics (Ball diameter: 0.3 mm) | | | | | |
|---|---|---|---|---|---|---|---|---|---|---|---|---|
| | | | | | | | Discoloration | | Spreading (μm) | | Oxygen content (ppm) | |
| Sample | Sn | Ag | Cu | Al | P | Ge | 72 hr | 168 hr | 72 hr | 168 hr | 72 hr | 168 hr |
| Comparative example 1 | Remainder | 3 | 0.5 | — | — | — | ○ | ○ | 50 | 42 | 80 | 112 |
| Experimental example 12 | Remainder | 3 | 0.3 | 0.02 | — | 0.01 | X | X | 415 | 390 | 32 | 65 |
| Experimental example 13 | Remainder | 3 | 0.5 | 0.02 | — | 0.01 | X | X | 452 | 448 | 28 | 32 |
| Experimental example 14 | Remainder | 3 | 0.5 | 0.02 | — | 0.05 | X | X | 410 | 385 | 30 | 70 |
| Experimental example 15 | Remainder | 3 | 0.5 | 0.1 | — | 0.01 | X | X | 412 | 395 | 33 | 68 |
| Experimental example 16 | Remainder | 3 | 0.5 | 0.1 | — | 0.05 | X | X | 408 | 390 | 35 | 70 |
| Experimental example 17 | Remainder | 3 | 0.5 | 0.2 | — | 0.01 | X | Δ | 285 | 240 | 50 | 78 |
| Experimental example 18 | Remainder | 3 | 0.5 | 0.2 | — | 0.05 | X | Δ | 280 | 245 | 48 | 72 |
| Experimental example 19 | Remainder | 3 | 0.8 | 0.02 | — | 0.01 | X | X | 418 | 415 | 36 | 55 |

TABLE 4

| | Composition (wt %) | | | | | | High-temperature high-humidity characteristics (Ball diameter: 0.3 mm) | | | | | |
|---|---|---|---|---|---|---|---|---|---|---|---|---|
| | | | | | | | Discoloration | | Spreading (μm) | | Oxygen content (ppm) | |
| Sample | Sn | Ag | Cu | Al | P | Ge | 72 hr | 168 hr | 72 hr | 168 hr | 72 hr | 168 hr |
| Comparative example 1 | Remainder | 3 | 0.5 | — | — | — | ○ | ○ | 50 | 42 | 80 | 112 |
| Experimental example 6 | Remainder | 3 | 0.5 | — | 0.005 | — | Δ | ○ | 378 | 55 | 71 | 98 |
| Experimental example 7 | Remainder | 3 | 0.5 | — | 0.01 | — | Δ | Δ | 402 | 338 | 64 | 80 |
| Experimental example 8 | Remainder | 3 | 0.5 | — | 0.03 | — | Δ | Δ | 380 | 324 | 74 | 88 |
| Experimental example 20 | Remainder | 3 | 0.5 | — | 0.01 | 0.01 | X | Δ | 450 | 392 | 30 | 54 |
| Experimental example 22 | Remainder | 1 | 0.5 | — | 0.01 | 0.01 | X | Δ | 442 | 366 | 33 | 61 |

Referring to FIG. 6A, it can be seen that phosphorus-containing solder balls had higher oxidation resistances than a phosphorus-free solder ball. Specifically, after kept for about 168 hours, a phosphorus-free solder ball according to Comparative example 1 had an oxygen content of about 112 ppm, while a solder ball containing about 0.01 wt. % phosphorus according to Experimental example 7 had a reduced oxygen content of about 80 ppm. Also, as shown in FIG. 6B, after kept for about 168 hours in a high-temperature high-humidity atmosphere, the solder ball according to Experimental example 7 had a spreading of about 338 μm, which was higher than a spreading (i.e., about 42 μm) of the solder ball according to Comparative example 1, and exhibited an improved oxidation resistance.

It can be seen that a solder ball containing both phosphorus and germanium has a higher oxidation resistance than a solder ball containing phosphorus. A solder ball containing about 0.01 wt. % phosphorus and about 0.01 wt. % germanium according to Experimental example 20 had remaining oxygen contents of about 30 ppm and about 54 ppm and spreadings of about 450 μm and about 392 μm after kept in the high-temperature high-humidity atmosphere for about 72 hours and about 168 hours, respectively.

Figure 7A:
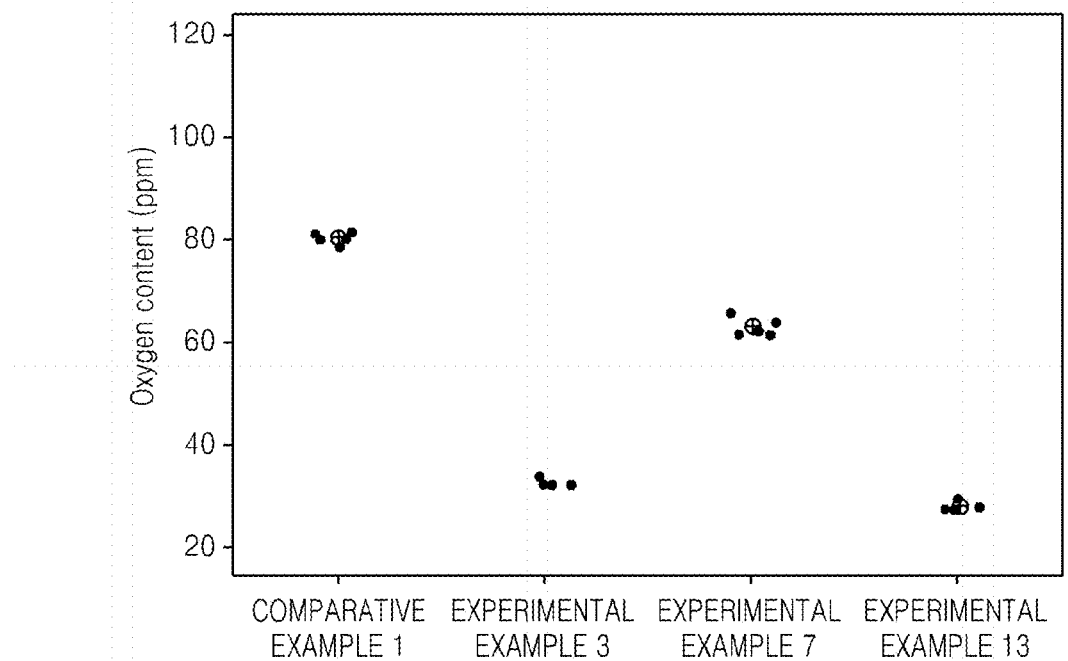
Figure 7B:
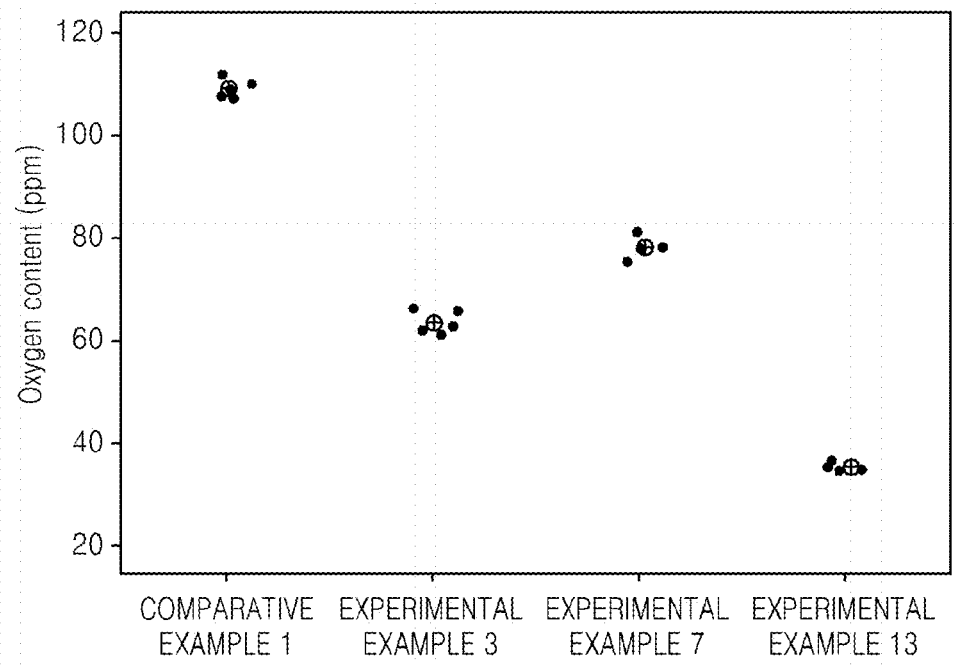

FIG. 7A is a graph showing the oxygen contents of solder balls according to embodiments of the present invention after 72 hours, and FIG. 7B is a graph showing the oxygen contents of the solder balls according to the embodiments of the present invention after 168 hours. FIGS. 7A and 7B show comparisons among solder balls according to some Experimental examples, which exhibited the highest oxidation resistances. For example, the solder ball containing about 0.02 wt. % aluminum according to Experimental example 3, the solder ball containing about 0.01 wt. % phosphorus according to Experimental example 7, and the solder ball containing about 0.02 wt. % aluminum and about 0.01 wt. % germanium according to Experimental example 13 are illustrated along with the solder ball according to Comparative example.

Referring to FIGS. 7A and 7B, after kept in the high-temperature high-humidity atmosphere, the aluminum-containing solder ball according to Experimental example 3 and the phosphorus-containing solder ball according to Experimental example 7 exhibited lower oxygen contents than the solder ball according to Comparative example 1. Also, the solder ball containing both aluminum and germanium according to Experimental example 13 exhibited the lowest remaining oxygen content and had the highest oxidation resistance in the high-temperature high-humidity atmosphere. In particular, after kept for about 72 hours, the aluminum-containing solder ball according to Experimental example 3 exhibited an oxygen content similar to that of the solder ball containing aluminum and germanium according to Experimental example 13. However, after kept for about 168 hours, the oxygen content of the aluminum-containing solder ball according to Experimental example 3 greatly increased and became much higher than that of the solder ball according to Experimental example 13. That is, the aluminum-containing solder ball had a high oxidation resistance for a predetermined time, but the oxidation resistance of the aluminum-containing solder ball was degraded after the predetermined time had elapsed. In contrast, the solder ball containing aluminum and germanium maintained a high oxidation resistance even after 168 hours.

Figure 8A:
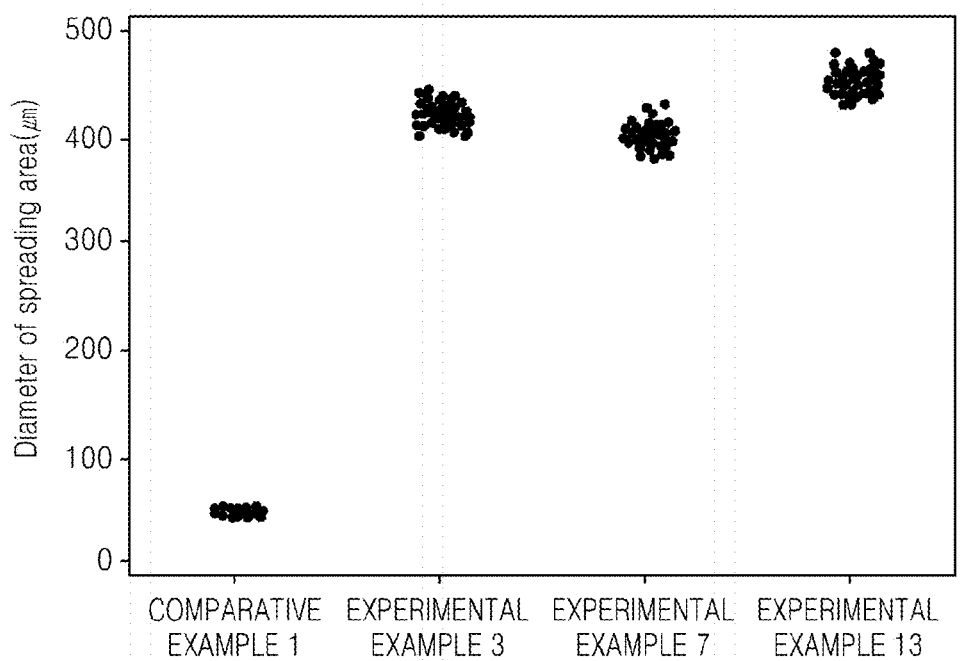
Figure 8B:
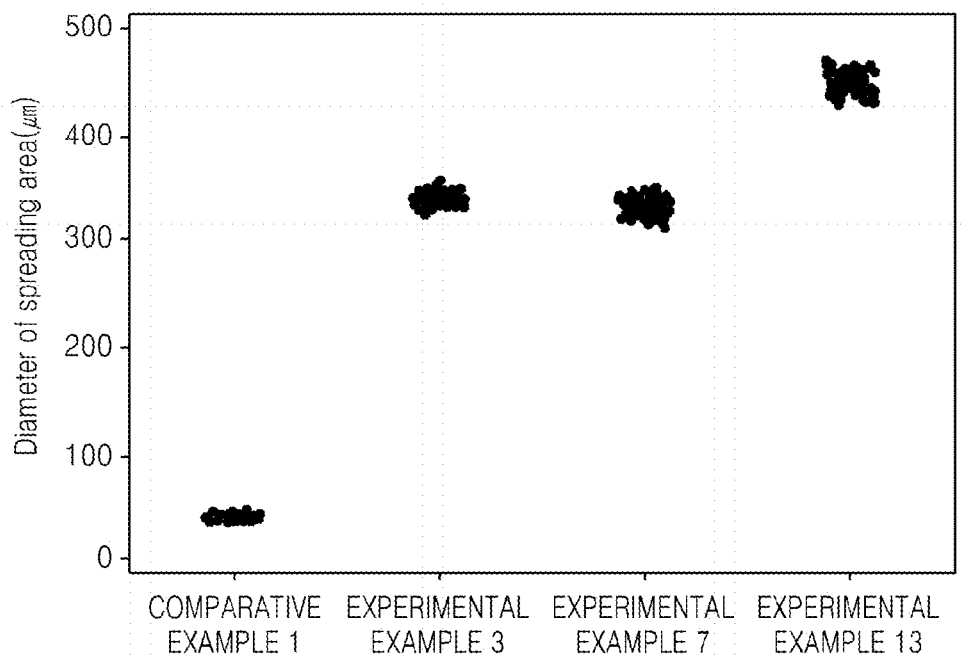

FIG. 8A is a graph showing the spreading characteristics of solder balls according to embodiments of the present invention after 72 hours, and FIG. 8B is a graph showing the spreading characteristics of the solder balls according to the embodiments of the present invention after 168 hours. In FIGS. 8A and 8B, the solder ball containing about 0.02 wt. % aluminum according to Experimental example 3, the solder ball containing about 0.01 wt. % phosphorus according to Experimental example 7, and the solder ball containing about 0.02 wt. % aluminum and about 0.01 wt. % germanium according to Experimental example 13 are illustrated along with the solder ball according to Comparative example.

Referring to FIGS. 8A and 8B, after kept for 72 hours in the high-temperature high-humidity atmosphere, the solder balls according to Experimental examples exhibited better spreading characteristics than the solder ball according to Comparative example. After kept for 168 hours in the high-temperature high-humidity atmosphere, the aluminum-containing solder ball according to Experimental example 3 and the phosphorus-containing solder ball according to Experimental example 7 exhibited degraded spreading characteristics, while the solder ball containing aluminum and germanium according to Experimental example 13 still maintained good spreading characteristics. Thus, it can be seen that the spreading characteristics of the solder ball are relevant to measurement results of the contents of oxygen remaining in the solder balls shown in FIGS. 7A and 7B.

FIGS. 9A through 9D are images showing the degrees of discoloration after solder balls according to embodiments of the present invention are kept for about 168 hours in high-temperature and high-humidity atmospheres.

FIG. 9A illustrates the degree of discoloration of the solder ball according to Comparative example. As observed from FIG. 9A, the ternary solder ball formed of silver-copper-tin to which aluminum or germanium was not added turned yellow. Referring to FIGS. 9B and 9C, it is observed that the solder ball containing about 0.02 wt. % aluminum according to Experimental example 3 and the solder ball containing about 0.01 wt. % phosphorus according to Experimental example 7 became somewhat dark and turned slightly yellow. However, referring to FIG. 9D, even if kept for 168 hours in the high-temperature high-humidity atmosphere, the solder ball containing about 0.02 wt. % aluminum and about 0.01 wt. % germanium according to Experimental example 13 still assumed silver gray and no discoloration was observed.

Figure 10:
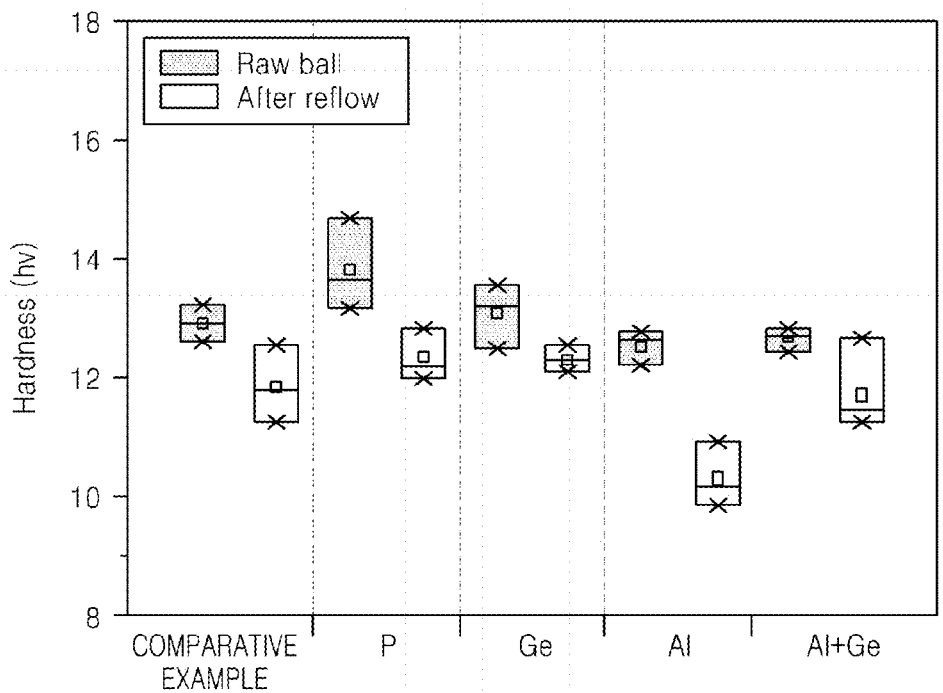
FIG. 10 is a graph showing results of a hardness test made on solder balls according to embodiments of the present invention.

FIG. 10 is a graph showing results of a hardness test made on solder balls according to embodiments of the present invention.

In FIG. 10, a solder ball containing about 1 wt. % silver, about 0.5 wt. % copper, and balance of tin was used as Comparative example. Also, Experimental examples were a solder ball containing about 0.02 wt. % aluminum, about 1 wt. % silver, about 0.5 wt. % copper, and balance of tin, a solder ball containing about 0.02 wt. % germanium, about 1 wt. % silver, about 0.5 wt. % copper, and balance of tin, and a solder ball containing 0.02 wt. % aluminum and about 0.02 wt. % germanium, about 1 wt. % silver, about 0.5 wt. % copper, and balance of tin, respectively. Referring to FIG. 10, in each of Comparative example and Experimental examples, it can be seen that the hardness of the solder ball was lower after a reflow process than in an initial state. In particular, the entire solder ball containing aluminum with a high ducility according to Experimental example had a greatly reduced hardness after the reflow process. Meanwhile, a phosphorus-containing solder ball according to Experimental example had an increased hardness after the reflow process. This is because a small amount of phosphorus may react with copper to form an inter-metallic compound and thus, the hardness and brittleness of the solder ball tend to increase.

FIG. 11 is a graph showing results of a drop test made on solder balls according to embodiments of the present invention.

In FIG. 11, a solder ball containing about 1 wt. % silver, about 0.5 wt. % copper, and balance of tin was used as Comparative example. Also, Experimental examples were a solder ball containing about 0.02 wt. % aluminum, about 1 wt. % silver, about 0.5 wt. % copper, and balance of tin, a solder ball containing about 0.02 wt. % germanium, about 1 wt. % silver, about 0.5 wt. % copper, and balance of tin, and a solder ball containing 0.02 wt. % phosphorus, about 1 wt. % silver, about 0.5 wt. % copper, and balance of tin, respectively. Table 5 shows the cumulative number of drop failures.

TABLE 5

| Cumulative failure rate (%) | Comparative example | Al-containing solder ball | P-containing solder ball | Ge-containing solder ball |
|---|---|---|---|---|
| 20 | 1 | 44 | 1 | 5 |
| 40 | 44 | 61 | 18 | 40 |
| 60 | 61 | 62 | 29 | 72 |
| 80 | 79 | 105 | 31 | 75 |
| 100 | 92 | 173 | 42 | 88 |

Referring to FIG. 11, it can be seen that the aluminum-containing solder ball had the best results on the drop test. The solder ball according to Comparative example exhibited a cumulative failure rate of about 20% at the first drop. This indicates that about 20% of all samples suffered disconnection of adhesion between the solder ball and the printed substrate after the first drop. After dropped 92 times, the solder ball according to Comparative example exhibited a cumulative failure rate of about 100%. Thus, it can be seen that all the samples suffered disconnection of adhesion between the solder ball and the printed substrate after the solder ball was dropped 92 times. In contrast, the aluminum-containing solder ball had a cumulative failure rate of about 20% after dropped 44 times, and had a cumulative failure rate of about 100% after dropped 173 times. Thus, the aluminum-containing solder ball produced better drop-test results than the solder ball according to Comparative example. It can be seen that as the ductility of the solder ball containing aluminum at a small content increased, the solder ball had a higher tolerance to mechanical impacts. Meanwhile, the phosphorus-containing solder ball had a cumulative failure rate of about 20% after a one-time drop, and had a cumulative failure rate of about 100% after dropped 42 times. Thus, it can be seen that the phosphorus-containing solder ball exhibited poorer drop characteristics than the solder ball according to Comparative example. As compared with the results of FIG. 10, bad drop characteristics of the phosphorus-containing solder ball is relevant with an increase in the hardness thereof. That is, when the solder ball contains phosphorus, the hardness or brittleness of the solder ball may increase. Thus, the phosphorus-containing solder ball may have a lower tolerance to mechanical impacts during drops.

Based on the experimental results for examining the high-temperature high-humidity characteristics of the solder balls according to the Experimental examples of the present invention, a tin-based solder ball containing about 0.02 to 0.2 wt. % aluminum and about 0.01 to 0.05 wt. % germanium was hardly discoloured and had only a small remaining oxygen content and good spreading characteristics, even if kept in a high-temperature high-humidity atmosphere. Accordingly, it can be seen that the solder ball containing about 0.02 to 0.2 wt. % aluminum and about 0.01 to 0.05 wt. % germanium had an excellent oxidation resistance.

Furthermore, a tin-based solder ball containing about 0.001 to 0.03 wt. % phosphorus and about 0.01 to 0.05 wt. % germanium was hardly discoloured and had only a small remaining oxygen content and good spreading characteristics. Thus, it can be seen that the solder ball containing about 0.001 to 0.03 wt. % phosphorus and about 0.01 to 0.05 wt. % germanium had an excellent oxidation resistance.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A tin (Sn)-based solder ball comprising:
   about 0.2 to 4 wt. % (weight percent) silver (Ag);
   about 0.1 to 1 wt. % copper (Cu);
   about 0.001 to 0.3 wt. % aluminum (Al);
   about 0.001% to 0.1 wt. % germanium (Ge); and
   balance of tin (Sn) and unavoidable impurities.

2. The tin-based solder ball of claim 1, which comprises about 0.2 to 4 wt. % silver, about 0.1 to 1 wt. % copper, about 0.002 to 0.2 wt. % aluminum, about 0.002 to 0.05 wt. % germanium, and balance of tin and unavoidable impurities.

3. The tin-based solder ball of claim 1, which comprises about 0.2 to 4 wt. % silver, about 0.1 to 1 wt. % copper, about 0.002 to 0.2 wt. % aluminum, about 0.01 to 0.05 wt. % germanium, and balance of tin and unavoidable impurities.

4. A tin (Sn)-based solder ball comprising:
about 0.2 to 4 wt. % silver (Ag);
about 0.1 to 1 wt. % copper (Cu);
about 0.001 to 0.3 wt. % phosphorus (P);
about 0.001 to 0.1 wt. % germanium (Ge); and
balance of tin (Sn) and unavoidable impurities.

5. The tin-based solder ball of claim 4, which comprises about 0.2 to 4 wt. % silver, about 0.1 to 1 wt. % copper, about 0.001 to 0.3 wt. % phosphorus, about 0.002 to 0.05 wt. % germanium, and balance of tin and unavoidable impurities.

6. The tin-based solder ball of claim 4, which comprises about 0.2 to 4 wt. % silver, about 0.1 to 1 wt. % copper, about 0.001 to 0.03 wt. % phosphorus, about 0.01 to 0.05 wt. % germanium, and balance of tin and unavoidable impurities.

7. A semiconductor package comprising the tin-based solder ball of claim 1.

8. A semiconductor package comprising the tin-based solder ball of claim 2.

9. A semiconductor package comprising the tin-based solder ball of claim 3.

10. A semiconductor package comprising the tin-based solder ball of claim 4.

11. A semiconductor package comprising the tin-based solder ball of claim 5.

12. A semiconductor package comprising the tin-based solder ball of claim 6.

13. The tin (Sn)-based solder ball of claim 1 consisting essentially of:
about 0.2 to 4 wt. % (weight percent) silver (Ag);
about 0.1 to 1 wt. % copper (Cu);
about 0.001 to 0.3 wt. % aluminum (Al);
about 0.001% to 0.1 wt. % germanium (Ge); and
balance of tin (Sn) and unavoidable impurities.

14. The tin (Sn)-based solder ball of claim 4 consisting essentially of:
about 0.2 to 4 wt. % silver (Ag);
about 0.1 to 1 wt. % copper (Cu);
about 0.001 to 0.3 wt. % phosphorus (P);
about 0.001 to 0.1 wt. % germanium (Ge); and
balance of tin (Sn) and unavoidable impurities.

* * * * *